(12) United States Patent
Kim et al.

(10) Patent No.: US 10,854,840 B2
(45) Date of Patent: Dec. 1, 2020

(54) WINDOW MEMBER AND DISPLAY DEVICE INCLUDING THE SAME

(71) Applicant: SAMSUNG DISPLAY CO., LTD., Yongin-si (KR)

(72) Inventors: Youngkwan Kim, Seoul (KR); Junghwan Kim, Cheonan-si (KR); Sangeun Moon, Suwon-si (KR); Miso Park, Gumi-si (KR); Jungpyo Hong, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 115 days.

(21) Appl. No.: 15/358,165

(22) Filed: Nov. 22, 2016

(65) Prior Publication Data

US 2017/0324060 A1 Nov. 9, 2017

(30) Foreign Application Priority Data

May 4, 2016 (KR) ........................ 10-2016-0055573

(51) Int. Cl.
*H01L 51/52* (2006.01)
*B32B 7/12* (2006.01)
*B32B 17/06* (2006.01)
*G02B 5/20* (2006.01)

(52) U.S. Cl.
CPC ............ *H01L 51/5246* (2013.01); *B32B 7/12* (2013.01); *B32B 17/06* (2013.01); *G02B 5/208* (2013.01); *H01L 51/5281* (2013.01); *H01L 51/5284* (2013.01); *B32B 2457/20* (2013.01); *H01L 2251/303* (2013.01)

(58) Field of Classification Search
None
See application file for complete search history.

(56) References Cited

U.S. PATENT DOCUMENTS

| 7,036,946 B1 * | 5/2006 | Mosier ............. G02F 1/133617 349/68 |
| 8,623,990 B2 | 1/2014 | Watanabe et al. |
| 9,022,611 B2 | 5/2015 | Wang |
| 9,250,656 B2 | 2/2016 | Hirai et al. |
| 9,271,395 B2 | 2/2016 | Hongo et al. |
| 9,337,433 B2 | 5/2016 | Lim et al. |
| 9,354,476 B2 | 5/2016 | Han et al. |

(Continued)

FOREIGN PATENT DOCUMENTS

| CN | 1894601 | 1/2007 |
| CN | 102712799 | 10/2012 |

(Continued)

OTHER PUBLICATIONS

Chinese Examination Report for Chinese Patent Application or Patent No. 201710070839.6, dated Jul. 28, 2020.

*Primary Examiner* — Anthony Ho
*Assistant Examiner* — Kevin Quinto
(74) *Attorney, Agent, or Firm* — Kile Park Reed & Houtteman PLLC

(57) ABSTRACT

A window member includes a base substrate including a bottom surface, an upper surface opposed to the bottom surface, and a connecting surface between the bottom surface and the upper surface, and a blocking layer on the connecting surface, the blocking layer including an ultraviolet absorber.

22 Claims, 10 Drawing Sheets

(56) References Cited

U.S. PATENT DOCUMENTS

| | | | |
|---|---|---|---|
| 9,423,639 B2 | 8/2016 | Hongo et al. | |
| 9,690,329 B2 | 6/2017 | Jung et al. | |
| 10,199,600 B2 | 2/2019 | Lee et al. | |
| 2003/0127655 A1* | 7/2003 | Choi | B82Y 10/00 257/79 |
| 2006/0238671 A1* | 10/2006 | Kim | B82Y 20/00 349/71 |
| 2010/0327185 A1* | 12/2010 | Kindler | G09F 9/30 250/462.1 |
| 2011/0050657 A1* | 3/2011 | Yamada | H01L 27/3293 345/204 |
| 2014/0213137 A1* | 7/2014 | Miyake | G02F 1/1339 445/25 |
| 2014/0272322 A1* | 9/2014 | Lee | B05B 12/20 428/192 |
| 2014/0356572 A1* | 12/2014 | Kim | B32B 27/08 428/128 |

FOREIGN PATENT DOCUMENTS

| | | |
|---|---|---|
| CN | 103390374 | 11/2013 |
| CN | 103824519 | 5/2014 |
| CN | 103862763 | 6/2014 |
| CN | 103996357 | 8/2014 |
| CN | 104064119 | 9/2014 |
| CN | 104347000 | 2/2015 |
| CN | 104376785 | 2/2015 |
| CN | 104553184 | 4/2015 |
| CN | 105225610 | 1/2016 |
| JP | 2002-132157 | 5/2002 |
| KR | 10-0615998 B1 | 8/2006 |
| KR | 10-1023129 B1 | 3/2011 |
| KR | 10-2015-0060322 A | 6/2015 |
| KR | 10-2015-0081868 A | 7/2015 |

* cited by examiner

WINDOW MEMBER AND DISPLAY DEVICE INCLUDING THE SAME

CROSS-REFERENCE TO RELATED APPLICATION

Korean Patent Application No. 10-2016-0055573, filed on May 4, 2016, in the Korean Intellectual Property Office, and entitled: "Window Member and Display Device Including the Same," is incorporated by reference herein in its entirety.

BACKGROUND

1. Field

Embodiments relate to a window member and a display device including the same, and more particularly, to a window member having a blocking layer including an ultraviolet absorber and a display device including the same.

2. Description of the Related Art

Various types of display devices, for example, a liquid crystal display device (LCD), a plasma display panel device (PDP), an organic light emitting display device (OLED), a field effect display device (FED), an electrophoretic display device, etc. may be used to provide image information.

Such a display device includes a display panel for displaying an image and a window for protecting the display panel, etc. The window may be coupled to the display panel by means of a transparent optical adhesive member or the like.

SUMMARY

Embodiments are directed to a window member including a base substrate including a bottom surface, an upper surface opposed to the bottom surface, and a connecting surface between the bottom surface and the upper surface, and a blocking layer on the connecting surface, the blocking layer including an ultraviolet absorber.

The ultraviolet absorber may include a benzotriazol, benzophenone, salicylic acid, salicylate, cyanoacrylate, cinnamate, oxanilide, polystyrene, azomethine, or triazine-based compound, or a combination thereof.

The blocking layer may absorb light having a wavelength range of 300 nm to 400 nm inclusive.

The connecting surface may include at least one curved portion.

The connecting surface may include a first sub connecting surface connected to the bottom surface, the first sub connecting surface having a first curvature, and a second sub connecting surface disposed between the first sub connecting surface and the upper surface, the second sub connecting surface having a second curvature.

The blocking layer may be on the first sub connecting surface.

The first and second curvatures may be different from each other.

The second curvature may be greater than the first curvature.

The connecting surface may further include a third sub connecting surface between the first and second sub connecting surfaces.

The blocking layer may further include at least one of silica or titanium dioxide ($TiO_2$).

The window member may further include a light blocking layer on an edge region of the bottom surface.

The blocking layer may neighbor one side surface of the light blocking layer.

The blocking layer may extend on at least one surface of the upper surface or the bottom surface.

Embodiments are also directed to a display device including a display panel, a window member on the display panel, and an adhesive member between the display panel and the window member. The window member includes a base substrate including a bottom surface facing the display panel, an upper surface opposed to the bottom surface, and a connecting surface between the bottom surface and the upper surface, and a blocking layer on the connecting surface, the blocking layer including an ultraviolet absorber.

The ultraviolet absorber may include a benzotriazol, benzophenone, salicylic acid, salicylate, cyanoacrylate, cinnamate, oxanilide, polystyrene, azomethine, or a triazine-based compound, or a combination thereof.

The blocking layer may absorb light having a wavelength range of 300 nm to 400 nm inclusive.

The blocking layer may further include at least one of silica or titanium dioxide ($TiO_2$).

The display device may further include a light blocking layer on an edge region of the bottom surface.

The blocking layer may neighbor one side surface of the light blocking layer.

The display device may further include an optical member between the display panel and the adhesive member. The adhesive member may surround a side surface of the optical member.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
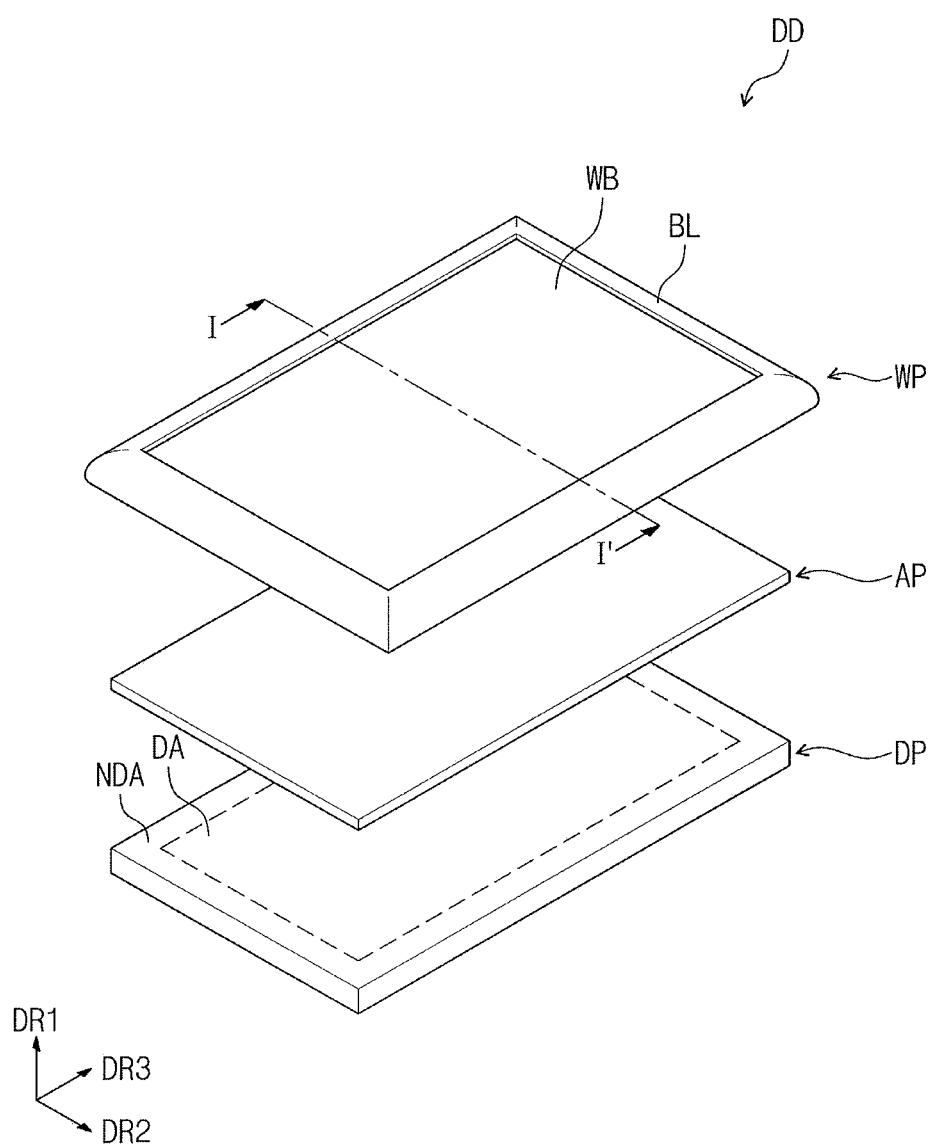
FIG. 1 illustrates an exploded perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an exploded perspective view of a display device DD according to an embodiment. The display device of FIG. 1 includes a display panel DP, a window member WP, and an adhesive member AP disposed between the display panel DP and the window member WP.

The display panel DP may generate an image and provide a front surface, on which the window member WP is disposed, with the generated image. The display panel DP may direct the generated image toward a first directional axis DR1. The display panel DP illustrated in FIG. 1 may include a display region DA on which an image is displayed and a non-display region NDA on which no image is displayed. FIG. 1 exemplarily illustrates a non-display region NDA which surrounds the display region DA and is disposed in the periphery of the display region DA. In some implementations, the non-display region NDA may be provided on one side of the display region DA. In some implementations, the non-display region NDA may be omitted.

The display panel DP may be, for example, an organic light emitting display panel, a liquid crystal display panel, a plasma display panel, an electrophoretic display panel, a microelectromechanical system (MEMS) display panel, an electrowetting display panel, or the like.

The display panel DP may be flexible. The term "flexible" indicates a property of being bendable, and may encompass various degrees of bendability from a completely foldable structure to a structure bendable to a several-nanometer degree. For example, the display panel DP may be a curved display panel or a foldable display panel. In some implementations, the display panel DP may be rigid.

In FIG. 1, a plane of the display panel DP parallel to a plane defined by a second directional axis DR2 and a third directional axis DR3 are illustrated to have a rectangular shape. In some implementations, the upper surface of the display panel DP may have a circular, elliptical, or polygonal shape. In some implementations, the display panel DP may have a curved shape only in a portion thereof.

In some implementations, the display panel DP may include both a planar region and a curved region. The planar region may be a flat portion parallel to the plane defined by the second and third directional axes DR2 and DR3, and the curved region may be a bent portion that is bent from the flat portion. The curved region may be a portion that is bent from an edge of the planar region. The display panel DP may have one curved region bent from one side of the planar region or may include two curved regions bent from edges of the planar region. In some implementations, the curved regions may be disposed on all the edges of the planar region.

Referring to FIG. 1, an adhesive member AP may be disposed on the display panel DP. The adhesive member AP may couple the display panel DP and the window member WP. The adhesive member AP may be an optical transparent adhesive layer.

The adhesive member AP which is the optical transparent layer may be provided in the form of an optical clear adhesive (OCA) or an optical clear resin (OCR). For example, the optical transparent adhesive layer that is an OCA may be provided in the form of a double-sided adhesive tape. The OCR may be provided in a form of a liquid adhesive resin between the display panel DP and the window member WP. The liquid adhesive resin may be transformed into a form of the adhesive member AP fixed through an ultraviolet curing process.

The adhesive member AP may include any one of an acryl adhesive, a silicone adhesive, or a urethane adhesive. The adhesive member AP may have a form in which a liquid adhesive resin is thermally cured or optically cured. For example, the adhesive resin constituting the adhesive member AP may include an uncured cross-linkable reactive group. The adhesive resin may include materials that may be post-cured by ultraviolet light. For example, the adhesive resin may include an uncured oligomer or a monomer. The uncured oligomer or the monomer may include a cross-linkable group. The uncured cross-linkable reactive group may increase the degree of cross-linking by inducing a cross-linking reaction. The cross-linkable reactive group may be a reactive group that may be thermally cured or optically cured. The adhesive resin may include an initiator. The initiator may be a thermal initiator or a photoinitiator. The initiator may induce an additional polymerization reaction of the monomer or the oligomer.

FIG. 1 illustrates the adhesive member AP as being separated from the display panel DP and the window member WP. In some implementations, the adhesive member AP may be disposed in a state of being coupled to the window member WP and the display panel DP. For example, in the display device DD, the window member WP and the display panel DP may be respectively disposed on the upper and lower surfaces of the adhesive member AP to be coupled to each other via the adhesive member AP.

FIG. 1 illustrates that the separated adhesive member AP has a rectangular shape. When the adhesive resin is provided in a liquid phase between the display panel DP and the window member WP which face each other, the adhesive member AP formed by curing the adhesive resin may be provided in various shapes according to the shapes of the display panel DP or the window member AP which face the adhesive member AP. The adhesive member AP may be disposed according to the curved shapes of the display panel DP and the window member WP which face each other, The adhesive member AP may be disposed to protrude outwardly from a portion in which the display panel DP and the window member WP overlap. Accordingly, the side surface of the adhesive member AP may include a curved surface. Also, the adhesive member AP may have a gradually increasing width toward the upper surface of the adhesive member AP adjacent to the window member WP from the lower surface of the adhesive member AP adjacent to the display panel DP. Also, in an embodiment, the side surface of the adhesive member AP may have a random shape.

The window member WP may be disposed over the display panel DP. The window member WP may include a base substrate WB and a blocking layer BL. The blocking layer BL may be disposed primarily on edge portions of the base substrate WB. Referring to FIG. 1, the blocking layer BL may be disposed to surround side surfaces of the base substrate WB.

The window member WP may be disposed to cover the front surface of the display panel DP and may thereby protect the display panel DP. For example, the area of the window member WP exposed to the front surface may be greater than the area of the upper surface of the display panel DP facing the window member WP.

The base substrate may be made of a suitable material. For example, the base substrate WB of the window member WP may be made of glass. For example, the base substrate WB may be made of a reinforced glass substrate. In some implementations, the base substrate WB may be made of a flexible plastic material. For example, the base substrate WB made of a plastic material may be made of polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, or a combination thereof.

The window member WP may further include a functional layer provided on the base substrate WB. For example, the functional layer may be a hard coating layer, an anti-fingerprint coating layer or the like.

The window member WP may further include a frame disposed to surround the periphery of the base substrate WB. The frame may be disposed to surround side surfaces of the base substrate WB. Also, in an embodiment, the frame may be disposed to surround the blocking layer BL.

The display apparatus DD of an embodiment may further include a housing accommodating the display panel DP. For example, the housing may accommodate the display panel DP The window member WP may be disposed on the housing while covering the front surface of the display panel DP. Also, the housing may accommodate both the display panel DP and the window member WP.

Figure 2:
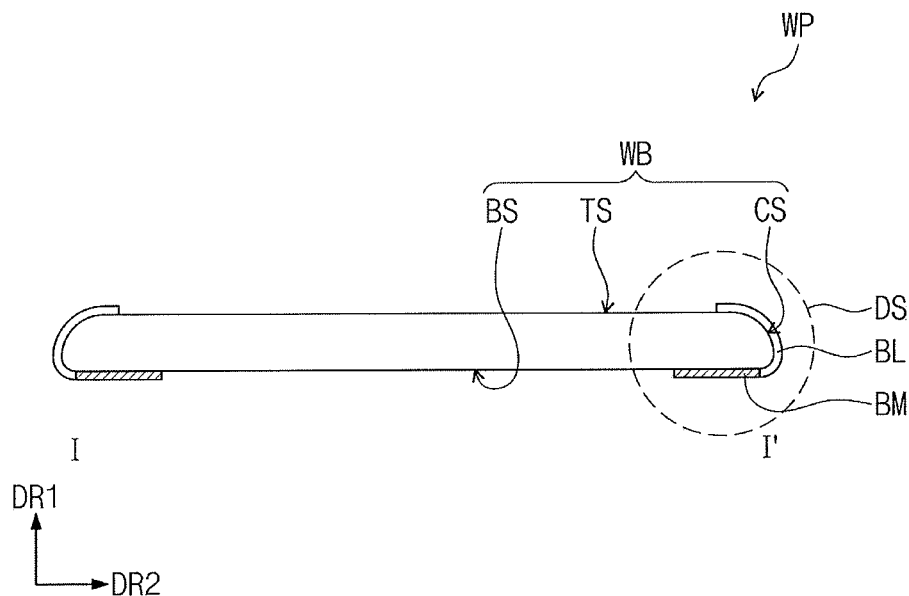
FIG. 2 illustrates a cross-sectional view of a window member corresponding to line I-I' of FIG. 1.
Figure 3:
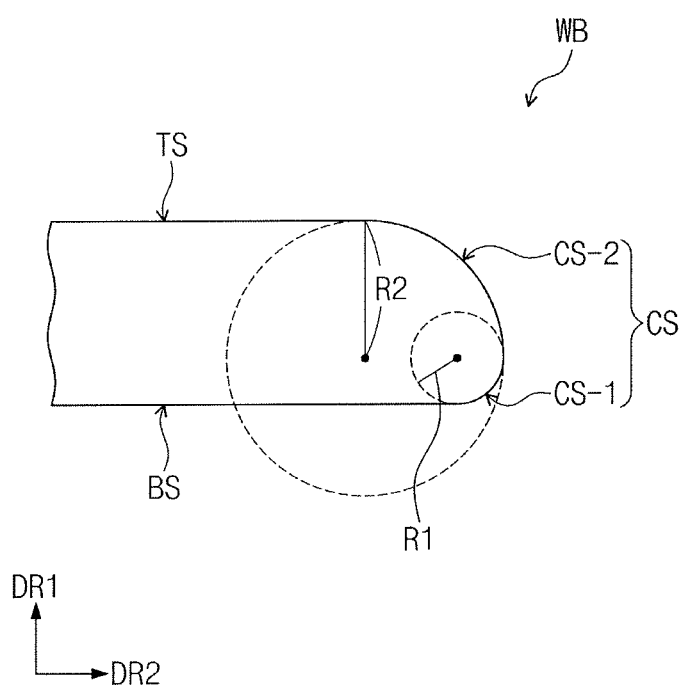
FIG. 3 illustrates a cross-sectional view of a portion of a base substrate in the window member of FIG. 2.
Figure 4A:
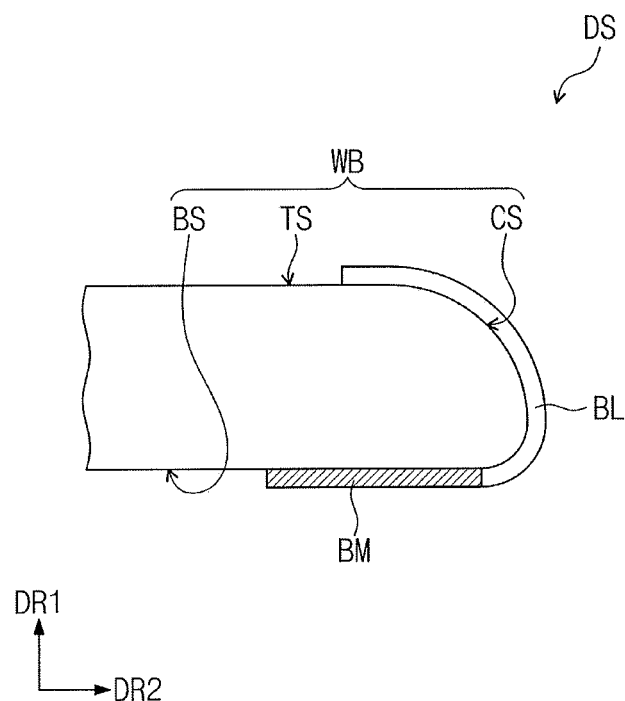
FIG. 4A illustrates a cross-sectional view of a portion of the window member of FIG. 2.
Figure 4B:
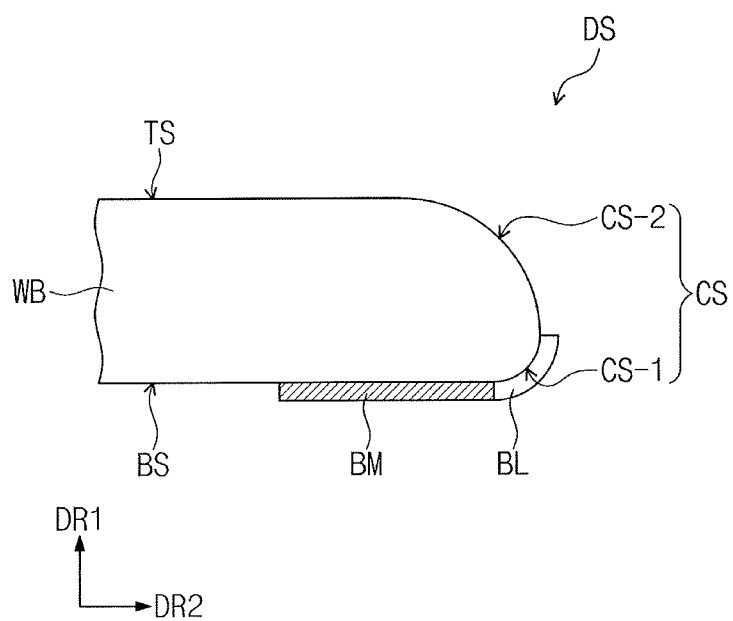
FIG. 4B illustrates a cross-sectional view of a portion of the window member of an embodiment.

The window member WP in an embodiment will be described in detail with reference to FIGS. 2 to 4B. FIG. 2 illustrates a view of a cross-section of the window member WP corresponding to line I-I' of FIG. 1. FIG. 3 illustrates an enlarged cross-sectional view of a portion of the base substrate WB of the window member WP of FIG. 2. FIGS. 4A to 4B illustrate enlarged cross-sectional views of a portion of the window member WP according to an embodiment. FIGS. 3 and 4A illustrate enlarged cross-sectional views of a portion corresponding to region "DS" of FIG. 2.

The window member WP may include a base substrate WB and a blocking layer BL. The base substrate WB may include a bottom surface BS, an upper surface TS opposed to the bottom surface BS, and a connection surface CS disposed between the bottom surface BS and the upper surface TS. The connecting surface CS may connect the bottom surface BS and the upper surface TS. The bottom surface BS and the upper surface TS may be parallel to each other.

Referring to FIGS. 2 and 3, the connecting surface CS of the base substrate WB may be a curved surface. The connecting surface CS may include at least one curved surface portion. In some implementations, the connecting surface CS may include both a curved surface portion and a planar surface portion and may include a plurality of planar portions.

Referring to FIG. 3, the connecting surface CS of the base substrate WB may include a first sub connecting surface CS-1 extending from the bottom surface BS and a second sub connecting surface CS-2 disposed between the upper surface TS and the first sub connecting surface CS-1. The first sub connecting surface CS-1 may be a curved surface having a first curvature, and the second sub connecting surface CS-2 may be a curved surface having a second curvature.

For example, in a cross-section of the base substrate WB, the cross-section being perpendicular to the base substrate WB, the first sub connecting surface CS-1 may be a portion of a circumference having a first radius of curvature R1, and the second sub connecting surface CS-2 may be a portion of a circumference having a second radius of curvature R2. Here, the centers of curvature of the first radius of curvature R1 and the second radius of curvature R2 may be positioned inside the base substrate WB.

The first and second curvatures may be different from each other. For example, in an embodiment illustrated in FIG. 3, the second curvature may be greater than the first curvature. In some implementations, the first curvature may be greater than the second curvature. In some implementations, the first and second curvatures may be the same as each other. In some implementations, at least one of the first sub connecting surface CS-1 and the second sub connecting surface CS-2 may be a portion of an elliptical circumference.

The window member WP may include a light blocking layer BM disposed on the bottom surface BS of the base substrate WB. The light blocking layer BM may be disposed on an edge region of the base substrate WB. The light blocking layer BM may be disposed on an outer region of the bottom surface BS of the base substrate WB. The light blocking layer BM may be a black printed layer or a white printed layer, as examples.

The blocking layer BL may be disposed on the connecting surface CS. The blocking layer BL may be disposed on the upper or lower surface of the connecting surface CS. For example, the blocking layer BL may be disposed to overlap the connecting surface CS. In an embodiment of FIG. 4A, the blocking layer BL may be disposed to overlap the entire connecting surface CS. For example, in the window member WP, the blocking layer BL may be disposed to surround an edge portion of the base substrate WB that is the connecting surface CS of the base substrate WB.

In an embodiment of FIG. 4B, the blocking layer BL may be disposed to overlap a portion of the connecting surface CS. As shown in FIG. 4B, the blocking layer BL may be disposed only on the first sub connecting surface CS-1 having a first curvature. In some implementations, the blocking layer BL may be disposed on a portion of the second sub connecting surface CS-2 and on the first sub connecting surface CS-1.

Referring to FIGS. 4A and 4B, the blocking layer BL may be disposed neighboring the light blocking layer BM disposed on the bottom surface BS. For example, one side surface of the blocking layer BL may be in contact with one side surface of the light blocking layer BM. Accordingly, the blocking layer BL on the connecting surface CS of the base substrate WB that is not covered by the light blocking layer BM may block ultraviolet light that may enter the base substrate WB from the outside. In FIGS. 4A and 4B, the light blocking layer BM and the blocking layer BL are illustrated as having a same thickness as each other. In some implementations, the thickness of the blocking layer BL may be equal to or less than the thickness of the light blocking layer BM.

The blocking layer BL may include an ultraviolet absorber. The blocking layer BL may include at least one compound from among benzotriazol, benzophenone, salicylic acid, salicylate, cyanoacrylate, cinnamate, oxanilide, polystyrene, azomethine, or triazine-based compounds. In the exemplified ultraviolet absorber, the term "-based" compound may include the exemplified compound or derivatives thereof. For example, a benzotriazol-based compound may include benzotriazol or a derivative of the benzotriazol.

The blocking layer BL including the ultraviolet absorber may block ultraviolet light incident to the connecting surface CS. The ultraviolet absorber of the blocking layer BL may absorb ultraviolet light incident through the connecting surface CS while maintaining the transparency of the blocking layer BL. For example, ultraviolet light incident from outside of the window member WP may be blocked by being absorbed into the ultraviolet absorber.

The blocking layer BL may absorb ultraviolet light having a wavelength range of about 200 nm to about 420 nm inclusive. For example, the blocking layer BL may absorb the ultraviolet light having a wavelength range of about 300 nm to about 400 nm inclusive. In an embodiment, the blocking layer BL of the window member WP may absorb about 95% or more of the ultraviolet light having a wavelength range of about 200 nm to about 420 mm inclusive.

The wavelength range of the absorbed ultraviolet light may vary according to the kind of and the amount of the ultraviolet absorber included in the blocking layer BL. For example, a benzotriazol-based ultraviolet absorber may absorb ultraviolet light of about 300 nm to about 385 nm inclusive. A benzophenon-based ultraviolet absorber may absorb ultraviolet light of about 300 nm to about 380 nm inclusive, and a triazine-based ultraviolet absorber may absorb ultraviolet light of about 260 nm to about 340 nm inclusive. Accordingly, in consideration of the wavelength range of the ultraviolet light to be blocked, the blocking layer BL may be configured to include ultraviolet absorbers in which different kinds of absorbers are mixed.

The blocking layer BL may have a thickness of about 1 μm to about 20 μm inclusive. When the thickness of the blocking layer BL is greater than about 1 μm, the ultraviolet blocking performance may be sufficient, and when the thickness of the blocking layer BL is less than about 20 μm, the transparency of the blocking layer BL may be sufficient.

The blocking layer BL may further include inorganic particles. The inorganic particles may be an additive agent to adjust the transmittance of the blocking layer BL. The inorganic particles may be amorphous nanoparticles. The average diameter of the inorganic particles may be about 5 nm to about 50 nm inclusive. The inorganic particles may include silica or titanium dioxide ($TiO_2$). The blocking layer BL may include at least one of silica or titanium dioxide. For example, the blocking layer BL may include an aerosol, which is a kind of fumed silica, as the inorganic particles.

The inorganic particles may decrease the transmittance of the light incident to the blocking layer BL. For example, the inorganic particles may scatter light incident to the blocking layer BL by using the difference in refractive indexes of the inorganic particles and the resin constituting the blocking layer BL, and may thereby decrease the transmittance of the blocking layer BL. The light transmittance of the blocking layer BL including the inorganic particles may be greater than about 0% and equal to or less than about 80%.

Accordingly, the blocking layer BL may effectively block ultraviolet light transmitted inside the base substrate WB by allowing the ultraviolet absorber to absorb the ultraviolet light and by allowing the inorganic particles to decrease the light transmittance.

The blocking layer BL may include a base resin, the ultraviolet absorber, and the inorganic particles. The ultraviolet absorber and the inorganic particles may be dispersed in the base resin. A base resin that is optically transparent and that can disperse the ultraviolet absorber and the inorganic particles may be used in the blocking layer BL. For example, the base resin may be an acrylate-based resin, for example, urethane acrylate.

A liquid resin in which the base resin, the ultraviolet absorber and inorganic particles are mixed may be coated onto the base substrate WB and then converted into a solid phase by a separate curing process to form the blocking layer BL. In some implementations, the blocking layer BL may be manufactured in a film shape in advance by using the liquid resin and then provided on the base substrate WB by using a bonding process.

The resin for forming the blocking layer BL may include a base resin, an ultraviolet absorber, inorganic particles, an initiator, and aromatic-based monomers. For example, the base resin may be urethane acrylate, and the ultraviolet absorber may be benzotriazol or benzophenol. The inorganic particles may include aerosil or titanium dioxide. The initiator may be a photoinitiator. The monomers may be 2-phenoxy ethyl acrylate (PHEA) or styrene.

The resin for forming the blocking layer BL may contain greater than about 0 phr and equal to or less than about 0.5 phr inclusive (parts per hundred resins) of the ultraviolet absorber, about 4 phr to about 5 phr of the inorganic particles, and about 2 phr to about 2.5 phr of the photoinitiator, in a weight ratio with respect to 100 of the base resin. Greater than about 0 phr and equal to or less than about 0.5 phr of an aromatic-based monomer may be contained in the resin for forming the blocking layer BL.

In an embodiment, the window member WP including the blocking layer BL formed to include the ultraviolet absorber and the inorganic particles may absorb or reflect ultraviolet light directed towards the window member WP from the outside and may block the ultraviolet light introduced through the base substrate WB.

Hereinafter, in describing the window members illustrated in FIGS. 5A to 8B, descriptions overlapping the descriptions described with reference to FIGS. 1 to 4B will not be repeated, and differences will be mainly described. FIGS. 5A, 6A, 7A, and 8A illustrate cross-sectional views of window members WP of embodiments. FIGS. 5B, 6B, 7B, and 8B illustrate respective cross-sectional views of portions DS of window members of FIGS. 5A, 6A, 7A, and 8A.

Figure 5A:
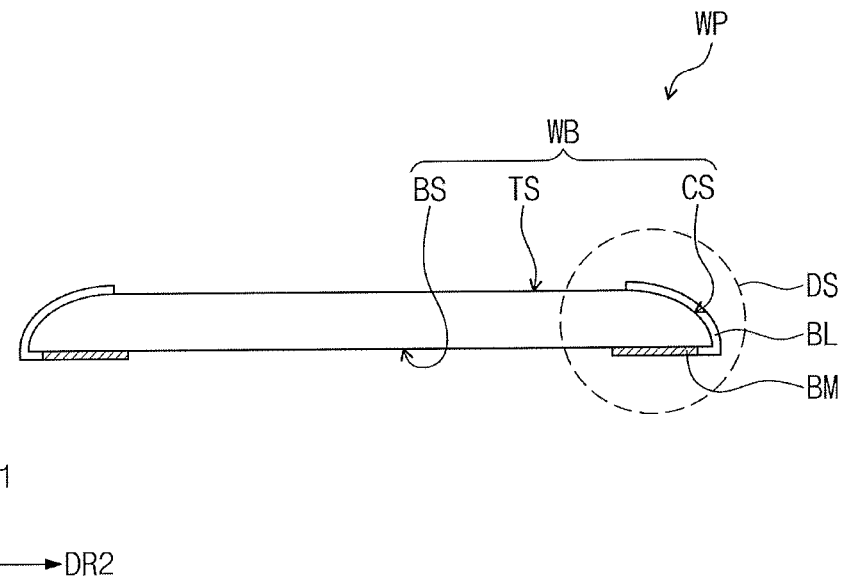
FIGS. 5A, 6A, 7A, and 8A illustrate cross-sectional views of window members of embodiments.
Figure 5B:
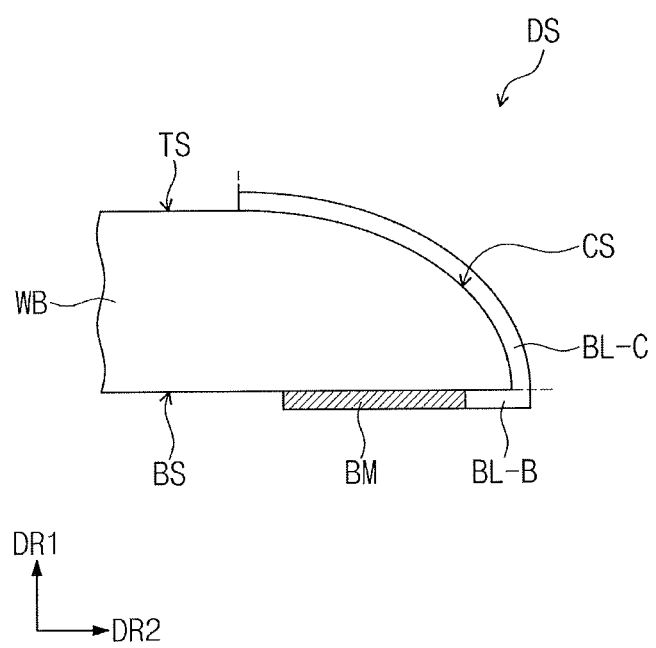
FIGS. 5B, 6B, 7B, and 8B illustrate respective cross-sectional views of portions of window members of embodiments of FIGS. 5A, 6A, 7A, and 8A.

Referring to FIGS. 5A and 5B, in a window member WP of an embodiment, a base substrate WB includes a bottom surface BS, an upper surface TS, and a connecting surface CS. FIG. 5A illustrates a view depicting a cross-section of a window member parallel to a surface defined by a first directional axis DR1 and a second directional axis DR2. Referring to FIG. 5A, in the window member WP of an embodiment, the width of a base substrate WB may gradually decrease in a direction from a bottom surface BS to an upper surface TS of the base substrate WB. For example, in the embodiment of FIG. 5A, the width of the bottom surface BS of the base substrate WB may be greater than the width of the upper surface TS. The connecting surface CS disposed between the bottom surface BS and the upper surface TS and connecting the bottom surface BS and the upper surface TS may be a curved surface. In the cross-section illustrated in FIG. 5A, the connecting surface CS, which is a curved surface may correspond, to a portion of a circular circumference or a portion of an elliptical circumference.

The window member WP of the embodiment illustrated in FIGS. 5A and 5B may include a blocking layer BL disposed on the connecting surface CS. The blocking layer BL may be further disposed on the bottom surface BS. The blocking layer BL may be disposed to extend along a portion of the bottom surface BS and surround the connection surface CS of the base substrate WB. The blocking layer BL may include a side surface blocking layer BL-C disposed on the connecting surface CS and a bottom surface blocking layer BL-B disposed on the bottom surface BS. The side surface blocking layer BL-C and the bottom surface blocking layer BL-B may be integrally disposed on portions of the connecting surface CS and the bottom surface BS. The bottom blocking layer BL-B may be disposed neighboring one side surface of a light blocking layer BM disposed on the bottom surface BS.

Figure 6A:
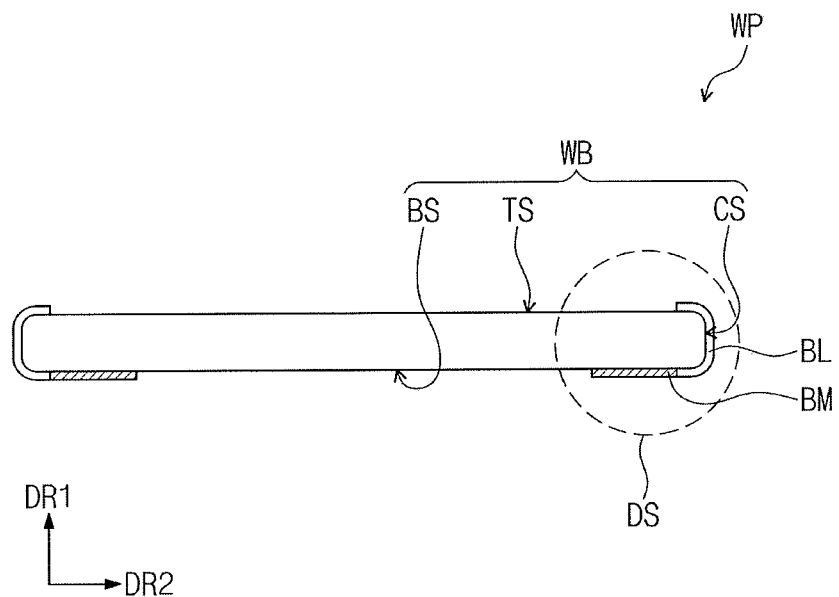
Figure 6B:
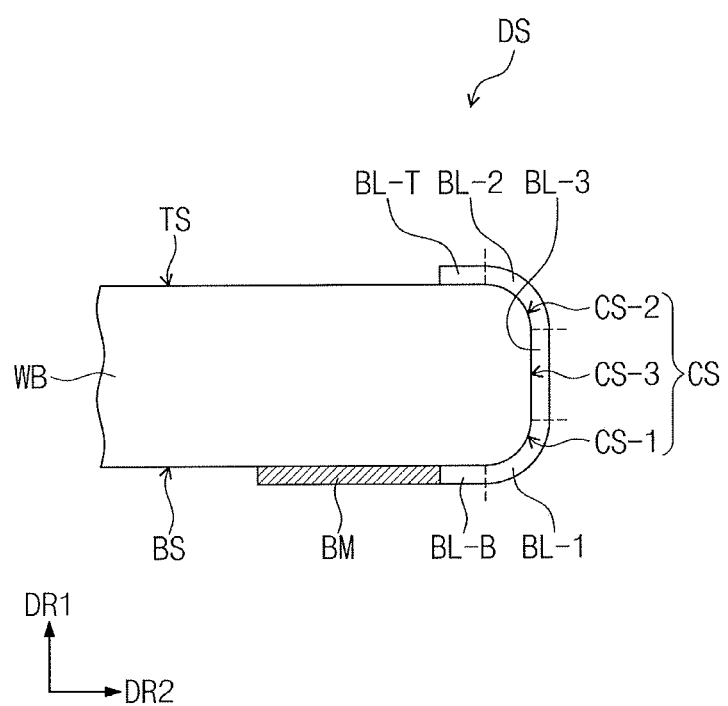

Referring to FIGS. 6A and 6B, in a window member WP according to an embodiment, a base substrate WB may include a bottom surface BS, an upper surface TS, and a connecting surface CS. The window member WP may include a blocking layer BL disposed on the connecting surface CS. The blocking layer BL may be disposed on the connecting surface CS and may further be disposed on the bottom surface BS and the upper surface TS of the base substrate WB.

In FIGS. 6A and 6B, the base substrate WB may include the bottom surface BS, the upper surface TS, and the connecting surface CS. The connecting surface CS may include at least one curved surface portion. Referring to FIG. 6B, the connecting surface CS may include a first sub connecting surface CS-1 connected to the bottom surface BS, a second sub connecting surface CS-2 connected to the upper surface TS, and a third sub connecting surface CS-3 disposed between the first sub connecting surface CS-1 and the second sub connecting surface CS-2. In an embodiment, the first sub connecting surface CS-1 and the second sub connecting surface CS-2 may be curved surfaces. The third sub connecting surface CS-3 may be planar. For example, the third sub connecting surface CS-3 may be a surface perpendicular to the bottom surface BS or to the upper surface TS. The first sub connecting surface CS-1 and the second sub connecting surface CS-2 may be curved surfaces having the same curvature.

Referring to FIGS. 6A and 6B, a blocking layer BL may be disposed on the connecting surface CS of the base substrate WB, may surround the connecting surface CS, and may extend along the bottom surface BS and the upper surface TS. The blocking layer BL may be disposed on an edge region of the bottom surface BS and on an edge region of the upper surface TS. In some implementations, the blocking layer BL may be disposed on the edge region of the bottom surface BS and on the connecting surface CS.

The blocking layer BL may include a first sub blocking layer BL-1, a second sub blocking layer BL-2, and a third sub blocking layer BL-3 respectively disposed on a first sub connecting surface CS-1, a second sub connecting surface CS-2, and a third sub connecting surface CS-3. The blocking layer BL may further include a bottom blocking layer BL-B disposed on the bottom surface BS and an upper blocking layer BL-T disposed on the upper surface TS. The first, second, and third blocking layers BL-1, BL-2, and BL3 disposed on the connecting surface CS, the bottom blocking layer BL-B, and the upper blocking layer BL-T may be integrally provided. The bottom blocking layer BL-B may be disposed neighboring one side surface of a light blocking layer BM disposed on the bottom surface BS.

Figure 7A:
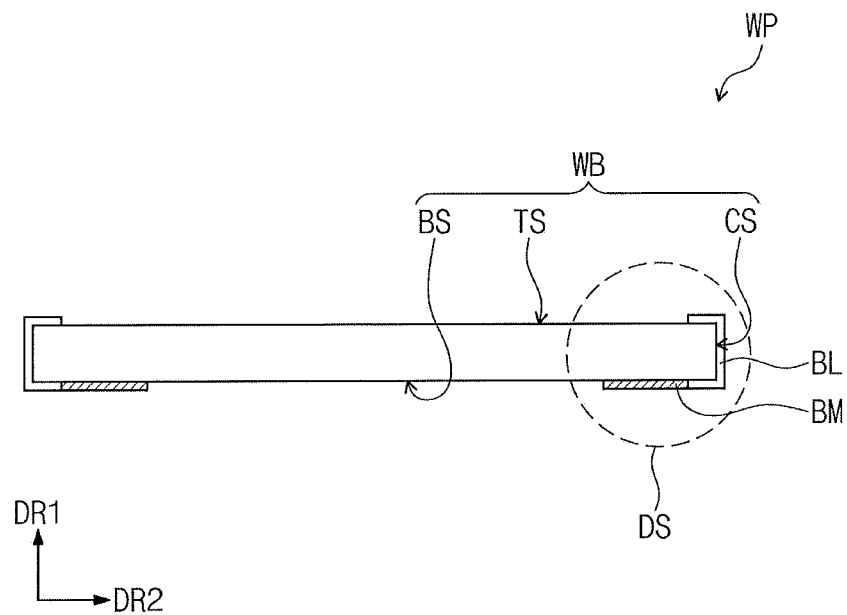
Figure 7B:
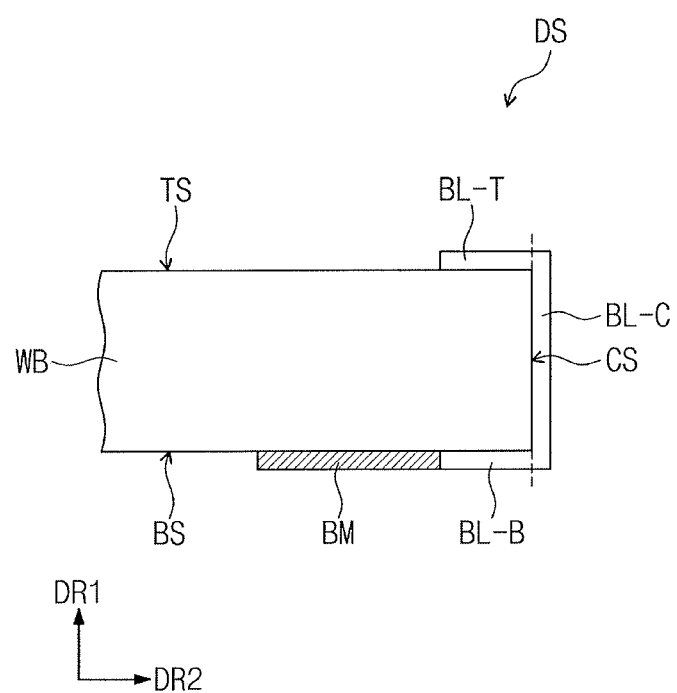

Referring to FIGS. 7A and 7B, in a window member WP according to an embodiment, a base substrate WB may include a bottom surface BS, an upper surface TS, and a connecting surface CS. The window member WP may include a blocking layer BL disposed on the connecting surface CS. The bottom surface and the upper surface TS of the base substrate WB may be parallel to each other. The connecting surface CS may be a plane perpendicular to the bottom surface BS and the upper surface TS. In some implementations, the connecting surface CS may be an inclined surface inclined with respect to the bottom surface BS.

In the window member WP according to the embodiment illustrated in FIGS. 7A and 7B, a blocking layer BL may be disposed on the connecting surface CS of the base substrate WB, may surround the connecting surface CS, and may be further disposed on the bottom surface BS and the upper surface TS. The blocking layer BL may be disposed on an edge region of the bottom surface BS and on an edge region of the upper surface TS. For example, the blocking layer BL may include a side surface blocking layer BL-C disposed on the connecting surface CS, a bottom blocking layer BL-B disposed on the bottom surface BS, and an upper blocking layer BL-T disposed on the upper surface TS. In some implementations, the blocking layer BL may be disposed on an edge region of the bottom surface BS and on the connecting surface CS. The bottom blocking layer BL-B may be disposed neighboring one side surface of a light blocking layer BM disposed on the bottom surface BS.

Figure 8A:
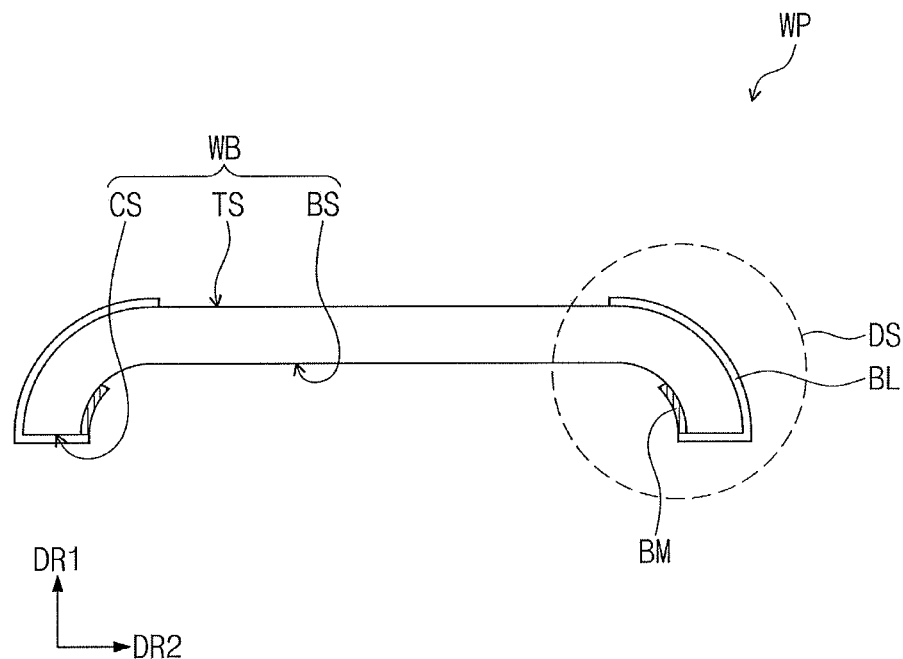
Figure 8B:
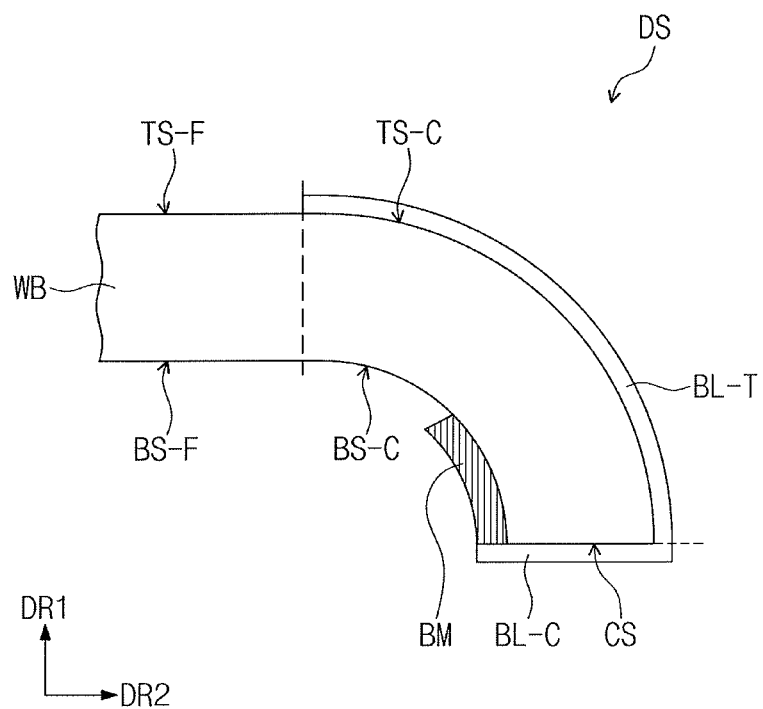

In FIGS. 8A and 8B, a window member WP according to an embodiment may include a base substrate WB, a blocking layer BL, and a light blocking layer BM. The base substrate WB may include a bottom surface BS, an upper surface TS opposed to the bottom surface BS, and a connection surface CS disposed between the bottom surface BS and the upper surface TS. In the window member WP according to the present embodiment, the base substrate WB may be a substrate in which an edge portion is bent. For example, the upper surface TS of the base substrate WB may include an upper flat surface TS-F and an upper bent surface TS-C. The bottom surface BS may include a bottom flat surface BS-F and a bottom bent surface BS-C. The upper bent surface TS-C may be bent at an edge of the upper flat surface TS-F, and the bottom bent surface BS-C may be bent at an edge of the bottom flat surface BS-F. For example, the base substrate WB may include a flat portion and a bent portion bent at an edge portion of the flat portion.

The blocking layer BL may be disposed on the connecting surface CS. The blocking layer BL may be further disposed on the upper surface TS of the base substrate WB. Referring to FIGS. 8A and 8B, the blocking layer BL may be disposed on the connecting surface CS and the upper bent surface TS-C. In FIGS. 8A to 8B, an upper blocking layer BL-T may be disposed on the entire upper bent surface TS-C, as illustrated in FIGS. 8A to 8B. In some implementations, the upper blocking layer BL-T may be disposed only on a portion of the upper bent surface TS-C. As shown in FIGS. 8A to 8B, the blocking layer BL may be disposed neighboring to a light blocking layer BM disposed on the bottom surface BS.

The window member of an embodiment may include, on the base substrate, a blocking layer including an ultraviolet absorber and may thereby block ultraviolet light provided from the outside. Also, yield may be improved in a bonding process of a display panel and a window member by using the window member of an embodiment in a display device. That is, the blocking layer may block the ultraviolet light, which is used to cure a side surface of the adhesive resin exposed to the outside in the bonding process of the window member and the display panel, so as not to be provided on the adhesive member disposed between the display panel and the window member. Accordingly, the ultraviolet light is blocked so as not to be partially provided through the window member, and may thereby increase the curing uniformity of the adhesive member, and may prevent non-uniform distribution of the adhesive member due to pre-curing.

Figure 9:
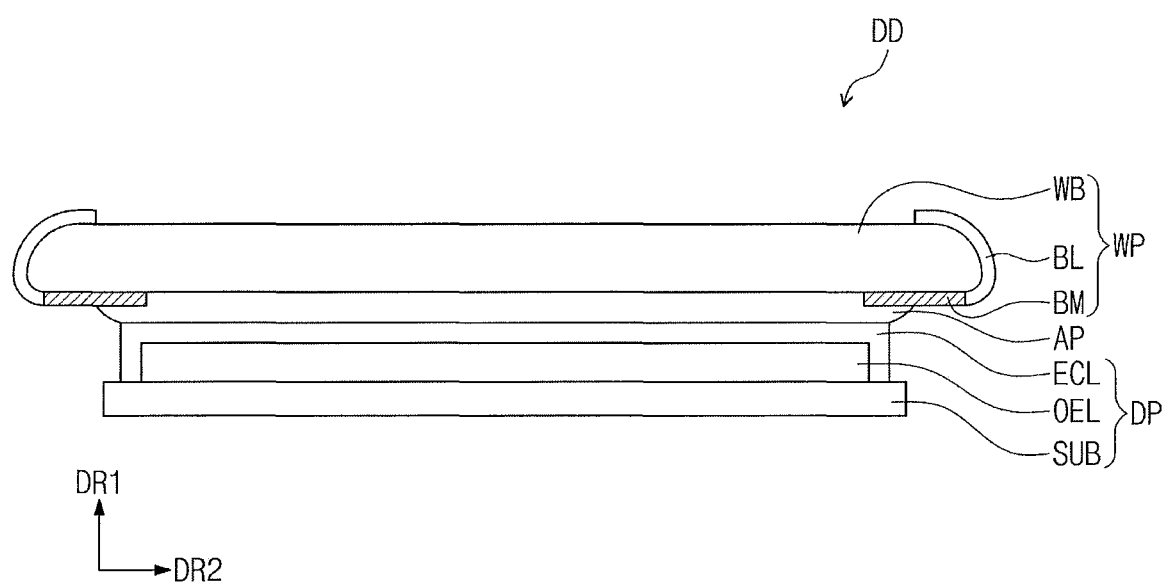
FIG. 9 illustrates a cross-sectional view of a display device according to an embodiment.

FIG. 9 illustrates a cross-sectional view depicting a display device DD according to an embodiment. For example, FIG. 9 may illustrate a cross-section of the display device DD depicted in FIG. 1. Hereinafter, in describing the display device illustrated in FIG. 9, descriptions overlapping the descriptions on the above-mentioned display device of FIG. 1 and the window member described with reference to FIGS. 2 to 4B will not be repeated, and differences will be mainly described.

The display device DD of an embodiment may include a display panel DP, an adhesive member AP disposed on the display panel DP, and a window member WP disposed on the adhesive member AP. The adhesive member AP may be disposed between the display panel DP and the window member WP and may couple the display panel DP and the window member WP to each other. In an embodiment, the adhesive member AP may be disposed between the base substrate WB and an encapsulation layer ECL of the display panel DP, and may be disposed to surround a portion of a light blocking layer BM.

In the embodiment illustrated in FIG. 9, the display panel DP may be an organic light emitting display panel. The display panel DP may include a base member SUB, a device layer OEL, and an encapsulation layer ECL. The device layer OEL may be disposed on the base member SUB. The encapsulation layer ECL may surround the device layer OEL and may be disposed on the base member SUB and the device layer OEL. The display panel DP may further include an optical member disposed on the encapsulation layer ECL. The optical member may be a phase retardation plate, a polarizing plate, or the like.

The base member SUB may be a glass substrate or a plastic substrate. For example, when the base member SUB is a plastic substrate, the base member SUB may include at least any one of polyimide (PI), polyethyleneterephthalate (PET), polyethylenenaphthalate (PEN), polyethersulphone (PES) or fiber reinforced plastics (FRP). At least one inorganic layer may be provided on the base member SUB. For example, a silicon nitride layer or a silicon oxide layer may be provided on the base member SUB.

The device layer OEL may include display elements. The display elements may be organic light-emitting diodes, as examples. The encapsulation layer ECL may protect the device layer OEL. The encapsulation layer ECL may be disposed to surround the device layer OEL and seal the device layer OEL. The encapsulation layer ECL may be, for example, a thin film encapsulation layer. In an embodiment, an encapsulation substrate may be used instead of the encapsulation layer ECL. The encapsulation substrate may be disposed to be spaced apart from the base member SUB with the device layer OEL therebetween. A sealing agent may be provided along a periphery of the encapsulation substrate and the base member SUB by forming a predetermined space.

The display device DD may further include a touch sensing unit on the display panel DP. The touch sensing unit may be disposed between the display panel DP and the window member WP. An adhesive layer may be provided between the touch sensing unit and the display panel DP The touch sensing unit and the display panel DP may be coupled via the adhesive layer. The touch sensing unit may be continuously provided on some components of the display panel DP, for example, on an encapsulation layer ECL without a separate adhesive layer.

To manufacture the display device according an embodiment, a process of bonding the window member and the display panel with the adhesive member therebetween may be provided. The adhesive member may be provided as a liquid adhesive resin on the bottom surface of the window member, and after the adhesive resin is provided, the display panel may be provided on the adhesive resin and may thereby be bonded to the window member. When a predetermined pressure is applied to the window member and the display panel which are bonded, the adhesive resin may be spread between the display panel and the window member to fill a gap between the display panel and the window member. To prevent the adhesive resin that fills the gap between the display panel and the window member and that is exposed to the outside, from flowing, external ultraviolet light may be provided. The provided ultraviolet light may control the flow of the resin by curing the exposed adhesive resin. The liquid phase adhesive resin may be cured by using a separate process, and may be formed as an adhesive member after being cured.

Figure 10A:
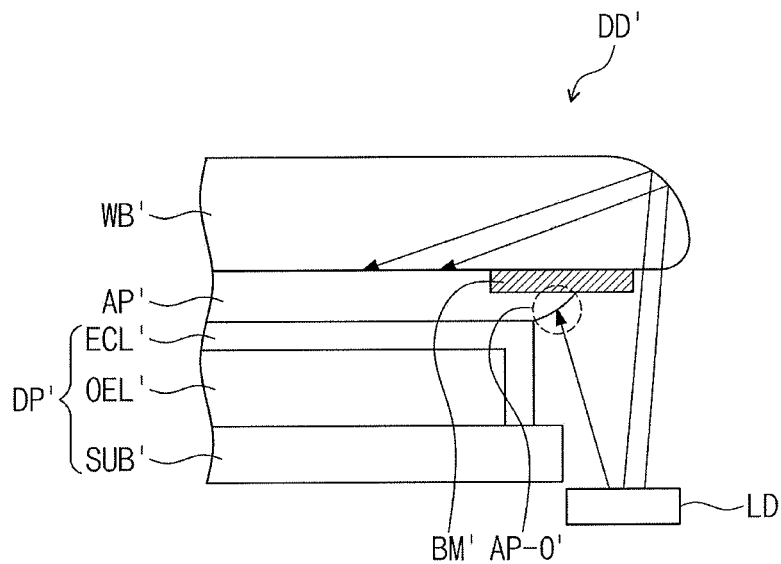
FIG. 10A illustrates a view depicting a traveling path of ultraviolet light in a typical display device.
Figure 10B:
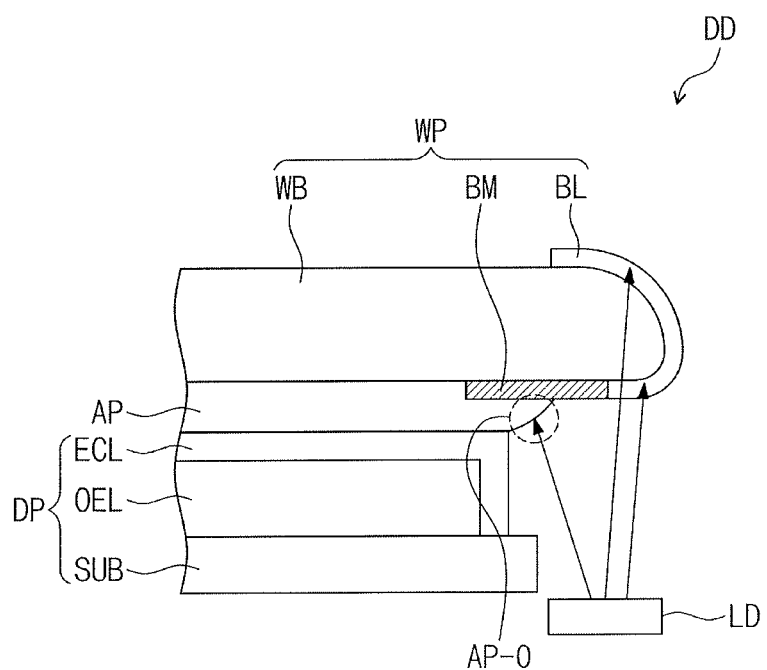
FIG. 10B illustrates a view depicting a traveling path of ultraviolet light in a display device of an embodiment.

FIGS. 10A and 10B schematically illustrate a process by which ultraviolet light may be provided to cure the exposed resin in order to prevent the exposed adhesive resin from flowing. FIG. 10A illustrates a manufacturing process for a general display device that does not include a blocking layer for blocking ultraviolet light, and FIG. 10B illustrates a manufacturing process for a display device according to an embodiment.

A light source LD may project ultraviolet light from outside the display devices DD' and DD toward the display devices DD' and DD. The light source LD may be a light emitting diode (LED) for providing ultraviolet light. The light source LD may be disposed at a position corresponding to an edge portion of the window member WP'. For example, in FIGS. 10A to 10B, the light source LD may be disposed under the display devices DD' and DD to provide exposed adhesive members AP-O' and AP-O with ultraviolet light. The light source LD may provide the ultraviolet light having a wavelength range of about 350 nm to about 400 nm inclusive. For example, a central wavelength of the light source LD may be about 355 nm or about 385 nm.

Referring to FIG. 10A, since the general display device DD' does not include a blocking layer for blocking ultraviolet light, ultraviolet light that is provided from external light source LD may be transmitted to an edge portion of the base substrate WB that is not occluded by a light blocking layer BM'. In FIG. 10A, the path of the ultraviolet light provided from the light source LD is illustrated by arrows. A portion of the provided ultraviolet light serves as a light source for curing the exposed adhesive member AP-O', and another portion of the ultraviolet light is transmitted through a base substrate WB' and is then reflected inside the base substrate WB', to be provided to a portion of the adhesive member AP' disposed between the base substrate WB' and the display panel DP'. The adhesive member AP' may be an adhesive resin in an uncured state. The ultraviolet light may be reflected from an inner surface of the base substrate WB' and the uncured adhesive resin may be partially cured by the provided ultraviolet light. Accordingly, due to the adhesive resin which is partially cured, the curing degree of the finally cured adhesive member AP' may partially vary. Accordingly, curing spots of the adhesive member AP' due to the difference in curing degree may appear. Also, when the adhesive resin is not sufficiently spread, the adhesive resin may be partially cured such that the adhesive member may not be uniformly disposed between the window member WP' and the display panel DP'.

In comparison, FIG. 10B schematically illustrates a process for curing the adhesive resin exposed in a display device DD according to an embodiment. In FIG. 10B, the path of the ultraviolet light provided from an external light source LD is illustrated by arrows. The display device DD of an embodiment may include a blocking layer BL on a window member WP. Referring to FIG. 10B, the blocking layer BL may be disposed neighboring a light blocking layer BM and may be disposed to surround a side surface of a base substrate WB. The ultraviolet light provided from an external light source LD may be partially provided to the exposed adhesive member AP-O. However, unlike in FIG. 10A, in the display device DD of an embodiment in FIG. 10B, ultraviolet light is not provided to an uncured adhesive resin provided between the display panel DP and the window member WP.

For example, the blocking layer BL may include an ultraviolet absorber to absorb or reflect the ultraviolet light provided from a light source LD. The blocking layer BL may thereby block the ultraviolet light from being directed toward the adhesive member AP through the base substrate WB, and thus may prevent the adhesive resin from being pre-cured. For example, the blocking layer BL may absorb ultraviolet light of about 300 nm to about 400 nm inclusive and may thereby block ultraviolet light of the light source LD having a central wavelength of about 355 nm or about 385 nm inclusive. Accordingly, the curing degree of the adhesive member AP may be made more uniform by including the blocking layer BL. The adhesive member AP may be uniformly disposed between the display panel DP and the window member WP by preventing the adhesive resin from being pre-cured before being sufficiently applied.

Figure 11:
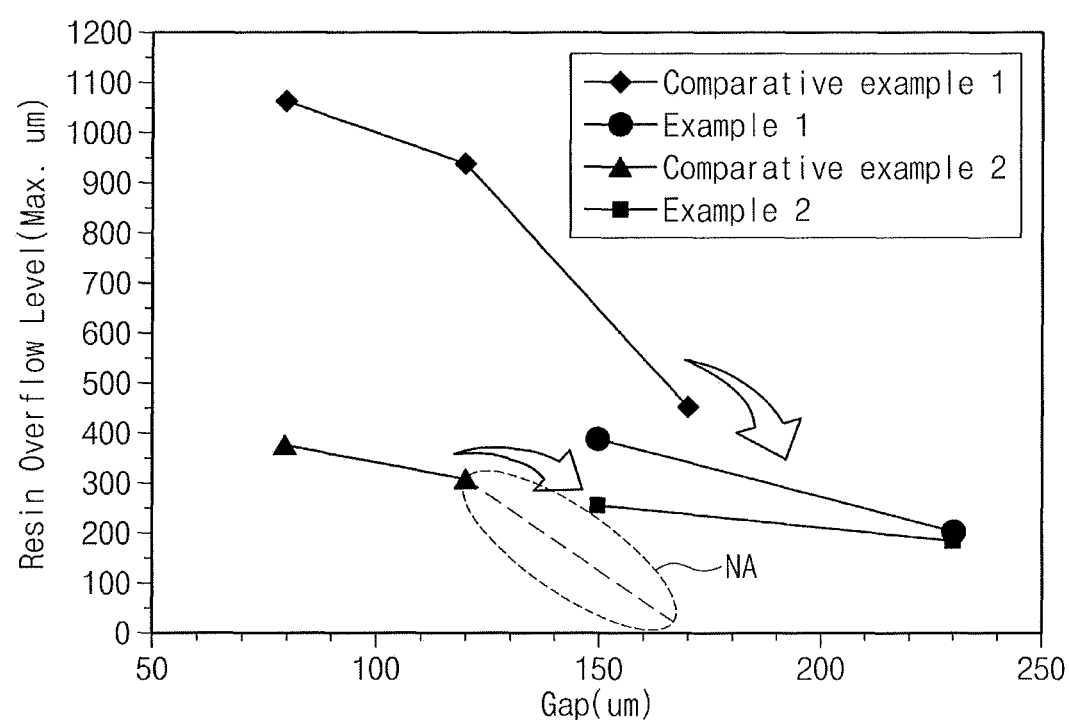
FIG. 11 illustrates a view depicting a result of comparing overflow phenomena of adhesive resins.

FIG. 11 compares and illustrates the overflow degrees of resins constituting adhesive members in a display device of an embodiment including a blocking layer and in a display device that does not include a blocking layer. In FIG. 11, Comparative Examples 1 and 2 illustrate experimental results for a display device that does not include a blocking layer. Examples 1 and 2 illustrate experimental results for a display device including a block layer. In the graph of FIG. 11, "Gap" represents a gap between a display panel and a window member, and "Resin Overflow Level" represents an overflow degree of an uncured adhesive rein.

Comparative example 1 and Example 1 illustrate a case in which the intensity of ultraviolet light provided from a light source to cure an exposed resin is about 200 mW. Comparative Example 2 and Example 2 illustrate a case in which the intensity of ultraviolet light is about 1500 mW. Comparing Examples 1 and 2, it may be understood that the greater the intensity of the provided ultraviolet light, the smaller the resin overflow level. For example, it may be ensured that when ultraviolet light having a greater intensity is provided to the exposed adhesive resin, the adhesive resin is cured in a short time and the amount of the exposed resin may be reduced.

Also, comparing Comparative example 1 with Example 1, it may be understood that the overflow resin level is reduced in Example 1 as compared to Comparative example 1. For example, it may be understood that even when the window member includes the blocking layer as in an embodiment, the efficiency of curing the exposed adhesive resin is not degraded.

Comparative Example 2 and Example 2 are the cases in which the intensities of ultraviolet light are increased in comparison with Comparative Example 1 and Example 1. In the case of Comparative Example 2, due to ultraviolet light having a strong intensity, the ultraviolet light transmitted through a window member is provided to an adhesive member, and thereby pre-cured portion may appear. In the graph of FIG. 11, the portion indicated as "NA" represents a case in which a pre-cured portion exists. In comparison, in Example 2, a resin over flow level may be controlled without a pre-cured portion even in the same gap.

Referring to the results of FIG. 11, the display device of an embodiment blocks ultraviolet light transmitted through the base substrate from reaching the adhesive member by including the blocking layer on the connecting surface of the base substrate of the window member. Thus, a freedom of selecting a process condition may be increased. For example, even when the intensity of the ultraviolet light provided to control an overflow resin level is increased, the adhesive member disposed between the display panel and the window member may be prevented from being pre-cured, and thus, the overflow resin level may be controlled in a short time by increasing the intensity of ultraviolet light. Thus, the flow of the adhesive resin may be easily controlled.

In an embodiment, a window member and a display device including the same may include a blocking layer that includes an ultraviolet light absorber. The blocking member may thereby block ultraviolet light provided to the window member. For example, the blocking member may block ultraviolent light from a light source used to cure an adhesive member that secures a window member to a display panel. Also, in an embodiment, a display device may block ultraviolet light from reaching an uncured adhesive resin through a window member in a manufacturing process. Thereby, the blocking member may prevent the adhesive member from being partially pre-cured. Thus, according to embodiments, the quality of a display device may be improved by including the adhesive member uniformly disposed between a display panel and the window member.

According to an embodiment, a window member may include a blocking layer including an ultraviolet light absorber and may thereby block ultraviolet light transmitted through a window edge portion.

According to an embodiment, a display device may include a window member including an ultraviolet light absorber. Thereby ultraviolet light transmitted through a window edge portion may be blocked from being transmitted to an adhesive member.

According to an embodiment, a display device may include a blocking layer including an ultraviolet light absorber. Thereby, ultraviolet light transmitted to a portion of an uncured adhesive member may be blocked, and pre-curing of the adhesive member may be prevented. Thus, the adhesive member may be uniform and an appearance quality of the display device may be improved.

According to an embodiment, a display device may include a window member having an ultraviolet absorber. Accordingly, overflow of an adhesive member toward a side surface of a display panel may be effectively controlled.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A window member, comprising:
    a base substrate including a bottom surface, an upper surface opposed to the bottom surface, and a connecting surface between the bottom surface and the upper surface;
    a blocking layer on the connecting surface and exposing a majority of each of the bottom surface and the upper surface, the blocking layer including an ultraviolet absorber; and
    a light blocking layer on the bottom surface, the light blocking layer being different from the blocking layer,
    wherein the blocking layer extends on a portion of the at least one surface of the upper surface or the bottom surface, and
    wherein the blocking layer has a higher transparency than the light blocking layer.

2. The window member as claimed in claim 1, wherein the ultraviolet absorber includes a benzotriazol, benzophenone, salicylic acid, salicylate, cyanoacrylate, cinnamate, oxanilide, polystyrene, azomethine, or triazine-based compound, or a combination thereof.

3. The window member as claimed in claim 1, wherein the blocking layer absorbs light having a wavelength range of 300 nm to 400 nm inclusive.

4. The window member as claimed in claim 1, wherein the connecting surface includes at least one curved portion.

5. The window member as claimed in claim 1, wherein the blocking layer further includes at least one of silica or titanium dioxide ($TiO_2$).

6. The window member as claimed in claim 1, wherein the blocking layer is a transparent layer.

7. The window member as claimed in claim 1, wherein the light blocking layer is a black printed layer or white printed layer.

8. The window member as claimed in claim 1, wherein the connecting surface includes:
    a first sub connecting surface connected to the bottom surface, the first sub connecting surface having a first curvature; and
    a second sub connecting surface disposed between the first sub connecting surface and the upper surface, the second sub connecting surface having a second curvature.

9. The window member as claimed in claim 8, wherein the blocking layer is on the first sub connecting surface.

10. The window member as claimed in claim 8, wherein the first and second curvatures are different from each other.

11. The window member as claimed in claim 8, wherein the second curvature is greater than the first curvature.

12. The window member as claimed in claim 8, wherein the connecting surface further includes a third sub connecting surface between the first and second sub connecting surfaces.

13. The window member as claimed in claim 1, wherein the light blocking layer is at an edge of the bottom surface.

14. The window member as claimed in claim 13, wherein the blocking layer neighbors one side surface of the light blocking layer.

15. A display device, comprising:
    a display panel;
    a window member on the display panel; and
    an adhesive member between the display panel and the window member, wherein the window member includes
    a base substrate including a bottom surface facing the display panel, an upper surface opposed to the bottom surface, and a connecting surface between the bottom surface and the upper surface, and
    a blocking layer directly on the connecting surface and exposing a majority of the upper surface, the blocking layer including an ultraviolet absorber.

16. The display device as claimed in claim 15, wherein the ultraviolet absorber comprises a benzotriazol, benzophenone, salicylic acid, salicylate, cyanoacrylate, cinnamate, oxanilide, polystyrene, azomethine, or a triazine-based compound, or a combination thereof.

17. The display device as claimed in claim 15, wherein the blocking layer absorbs light having a wavelength range of 300 nm to 400 nm inclusive.

18. The display device as claimed in claim 15, wherein the blocking layer further comprises at least one of silica or titanium dioxide ($TiO_2$).

19. The display device as claimed in claim 15, wherein the adhesive member is adhered to at least one of the bottom surface of the base substrate or a surface of a light blocking layer located on the bottom surface of the base substrate.

20. A display device, comprising:
    a display panel;
    a window member on the display panel; and
    an adhesive member between the display panel and the window member, wherein the window member includes:
    a base substrate including a bottom surface facing the display panel, an upper surface opposed to the bottom surface, and a connecting surface between the bottom surface and the upper surface,
    a blocking layer on the connecting surface and exposing a majority of the upper surface, the blocking layer including an ultraviolet absorber, and
    a light blocking layer on an edge region of the bottom surface.

21. The display device as claimed in claim 20, wherein the blocking layer neighbors one side surface of the light blocking layer.

22. A display device, comprising:
    a display panel;
    a window member on the display panel; and
    an adhesive member between the display panel and the window member,
    an optical member between the display panel and the adhesive member, wherein
    the adhesive member surrounds a side surface of the optical member, and
    the window member includes:
    a base substrate including a bottom surface facing the display panel, an upper surface opposed to the bottom surface, and a connecting surface between the bottom surface and the upper surface, and
    a blocking layer on the connecting surface and exposing a majority of the upper surface, the blocking layer including an ultraviolet absorber.

* * * * *